(12) United States Patent
Conner

(10) Patent No.: US 8,725,489 B2
(45) Date of Patent: May 13, 2014

(54) METHOD FOR TESTING IN A RECONFIGURABLE TESTER

(75) Inventor: George W. Conner, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 809 days.

(21) Appl. No.: 12/740,886

(22) PCT Filed: Oct. 30, 2008

(86) PCT No.: PCT/US2008/081686
§ 371 (c)(1),
(2), (4) Date: Jul. 20, 2010

(87) PCT Pub. No.: WO2009/058932
PCT Pub. Date: May 7, 2009

(65) Prior Publication Data
US 2010/0313071 A1     Dec. 9, 2010

Related U.S. Application Data

(63) Continuation of application No. 11/930,052, filed on Oct. 30, 2007, now abandoned.

(51) Int. Cl.
*G06F 17/50* (2006.01)
*G06F 7/60* (2006.01)

(52) U.S. Cl.
USPC .......................................................... 703/23

(58) Field of Classification Search
None
See application file for complete search history.

(56) References Cited

U.S. PATENT DOCUMENTS

| 5,150,048 | A | 9/1992 | McAuliffe et al. | |
|---|---|---|---|---|
| 5,243,273 | A | 9/1993 | McAuliffe et al. | |
| 5,892,897 | A * | 4/1999 | Carlson et al. | 714/37 |
| 6,484,280 | B1 | 11/2002 | Moberly | |
| 6,665,817 | B1 | 12/2003 | Rieken | |
| 6,856,950 | B1 * | 2/2005 | Abts et al. | 703/13 |
| 6,894,914 | B2 | 5/2005 | Perroni et al. | |
| 6,990,423 | B2 * | 1/2006 | Brown et al. | 702/117 |
| 7,007,203 | B2 * | 2/2006 | Gorday et al. | 714/37 |

(Continued)

FOREIGN PATENT DOCUMENTS

| JP | 1998-048296 A | 2/1998 |
|---|---|---|
| JP | 2001-174522 A | 6/2001 |

OTHER PUBLICATIONS

Evans, A.C., "The New ATE: Protocol Aware," International Test Conference, Oct. 21-26, 2007, Paper 20.1, IEEE, pp. 1-10.

(Continued)

*Primary Examiner* — Shambhavi Patel
(74) *Attorney, Agent, or Firm* — Wolf, Greenfield & Sacks, P.C.

(57) ABSTRACT

In some implementations, a method for testing is provided, which includes simulating a functional operational environment for a first type device-under-test with a tester. This includes recognizing a non-deterministic response signal having a predetermined protocol, receiving the non-deterministic response signal from the first type device-under-test, ascertaining an expected stimulus signal to be transferred to the first type device-under-test from the non-deterministic response signal based on the predetermined protocol, and initiating transmission of the expected stimulus signal to the first type device-under-test. The method further includes simulating a functional operational environment for a second type device-under-test with the tester after testing the first type device-under-test.

31 Claims, 9 Drawing Sheets

(56) References Cited

U.S. PATENT DOCUMENTS

| | | | |
|---|---|---|---|
| 7,013,417 B1* | 3/2006 | Burlison et al. | 714/744 |
| 7,028,235 B1 | 4/2006 | Kato | |
| 7,131,046 B2* | 10/2006 | Volkerink et al. | 714/732 |
| 7,181,660 B2* | 2/2007 | Krech et al. | 714/724 |
| 7,191,257 B2* | 3/2007 | Ali Khan et al. | 710/22 |
| 7,212,941 B2* | 5/2007 | Sivaram et al. | 702/120 |
| 7,216,273 B2* | 5/2007 | Phelps et al. | 714/724 |
| 7,222,261 B2 | 5/2007 | Song | |
| 7,222,279 B2 | 5/2007 | Tanimura | |
| 7,290,193 B2* | 10/2007 | Kadkade et al. | 714/742 |
| 7,418,639 B2* | 8/2008 | Natarajan | 714/724 |
| 7,509,226 B2* | 3/2009 | Hops et al. | 702/117 |
| 7,523,367 B2* | 4/2009 | Fagerness et al. | 714/719 |
| 7,590,903 B2* | 9/2009 | Volkerink et al. | 714/725 |
| 7,769,292 B2 | 8/2010 | Sylvester et al. | |
| 7,788,564 B2* | 8/2010 | McGoldrick et al. | 714/738 |
| 2002/0162046 A1 | 10/2002 | Krech et al. | |
| 2005/0010598 A1* | 1/2005 | Shankar | 707/104.1 |
| 2005/0138500 A1* | 6/2005 | Sul et al. | 714/724 |
| 2007/0266288 A1* | 11/2007 | Volkerink et al. | 714/738 |
| 2008/0046699 A1* | 2/2008 | Pauw et al. | 712/227 |
| 2009/0113245 A1* | 4/2009 | Conner | 714/33 |
| 2009/0204355 A1 | 8/2009 | Vold | |

OTHER PUBLICATIONS

International Search Report and Written Opinion for International Application No. PCT/US2008/081685 mailed Jun. 29, 2009.
International Search Report and Written Opinion for International Application No. PCT/US2008/081686 mailed Jun. 26, 2009.
Office Action issued Feb. 21, 2014 in Chinese Application No. 200880121439.2 (Partial translation included).

* cited by examiner

METHOD FOR TESTING IN A RECONFIGURABLE TESTER

RELATED PATENT APPLICATIONS

The present application is related to U.S. patent application Ser. No. 11/929,984, filed Oct. 30, 2007, entitled PROTOCOL AWARE DIGITAL CHANNEL APPARATUS; by George W. Conner, assigned to the same assignee as the present invention, and published as U.S. Patent Application Publication 2009-0113245, and is incorporated herein by reference. The present application is a national stage application under 35 U.S.C. §371 of PCT Application Ser. No. PCT/US08/81686, filed Oct. 30, 2008, which is a continuation of, and claims the benefit of, U.S. patent application Ser. No. 11/930,052, filed Oct. 30, 2007 and entitled A METHOD FOR TESTING IN A RECONFIGURABLE TESTER, by George W. Conner, assigned to the same assignee as the present invention, published as U.S. Patent Application Publication No. 2009-0112548, and which is also hereby incorporated herein by reference.

BACKGROUND

Automated stored pattern functional testing affords a critical step in the production of integrated circuit (IC) devices to provide parametric and operational characterization of the devices. An automatic test equipment system includes test circuitry that is connected to a control computer. The control computer provides a user interface that accepts and stores functional test pattern data for activating the test circuitry to provide stimulus signals to a device-under-test and receives the response signals from the device-under-test. The response signals are evaluated to determine the parametric and operational characterization of the integrated circuit devices.

The device-under-test (DUT) is mounted on a device interface board or DIB which provides the physical interface from/to the pin electronics. The pin electronics circuitry is the electrical interface that provides/receives the electrical test stimulus/response signals to/from the device-under-test via the DIB. The test stimulus signals from the test circuitry are supplied through pin electronics to the device-under-test via the DIB. The test response signals from the device-under-test are transferred through DIB to the pin electronics and on to the test circuitry. The test stimulus signals and the test response signals are correlated by the test circuitry to determine whether the device-under-test has passed or failed the test.

The stimulus signals generated by the test circuitry include data signals and clock signals to synchronize the stimulus input. The effectiveness of the test depends on the accurate placement of these signals relative to one another. For example, several different signals, such as, clock, data, and enable signals are coordinated and triggered at appropriate times to ensure that meaningful data is acquired during the test process. Inaccuracy of clock and data signal edge placement will result in false test results. As the operating speed of devices to be tested increases, the margins of error for edge placement accuracy decreases.

A system-on-a-chip (SOC) provides multiple digital and analog integrated circuit functions incorporated on the same semiconductor substrate. An example of an SOC is a cellular telephone that incorporates not only cellular telephone receiving, processing, and transmitting functions, but also photographic and video processing functions, audio digital signal processing and semiconductor memory circuits. Presently, in most SOC testing, the individual functions of an SOC are tested separately in multiple testing methods, such as by SCAN testing, Built-In-Self-Test (BIST), and functional testing. System Level Test typically employs custom circuitry and is generally only used for high average selling price low mix devices, such as microprocessors. A final system level test may be implemented on customized test apparatus created specifically for the testing of specific SOC devices such as microprocessors. Although it would be desirable to perform a System Level Test for other SOC devices, building custom functional test apparatuses for low average selling price SOCs is not cost effective.

A difficulty in testing SOCs with automatic test circuitry is that the parametric and individual functional testing with the automatic test circuitry is a deterministic test operation. The test stimulus signals are applied with certain timing and structure, and the test response signals are expected to have a particular timing and structure. If the test response signals do not match the expected timing and structure for the given parameters, the SOC device-under-test is determined to have failed. The functions of the SOC device may operate with differing timing and clocking specifications and may in fact operate asynchronously. An SOC device may be operational when the response test signals indicate otherwise, when the asynchronicity of the communicating functions cause the test response signals to appear incorrect.

There have been attempts within present automatic test equipment systems to simulate the operating conditions of an SOC device-under-test. Because of the nondeterministic function of the asynchronous communication between circuit functions, the normal operating environment of the functions can not be accurately recreated for the SOC device-under-test. Present automatic test equipment environments lack the ability to easily and accurately provide the nondeterministic electrical and timing conditions of the normal operating environment of the SOC device-under-test. This lack of the non-deterministic electrical and timing conditions within automatic test equipment systems, further do not measure the margin of error for an SOC device-under-test with regard to its tolerance under varying operational conditions that may be present in its normal operational environment.

Therefore, what is needed is an automatic test equipment system capable of providing deterministic and nondeterministic test stimulus signals. The nondeterministic test stimulus signals provide the electrical and timing protocol of the normal operating environment of the device-under-test such that the automatic test equipment system responds to test response signals of the device-under-test as though the device-under-test is operating in its normal environment.

SUMMARY

In some implementations, a method for testing is provided. The method includes simulating a functional operational environment for a first type device-under-test with a tester. This includes recognizing a non-deterministic response signal having a predetermined protocol, receiving the non-deterministic response signal from the first type device-under-test, ascertaining an expected stimulus signal to be transferred to the first type device-under-test from the non-deterministic response signal based on the predetermined protocol, and initiating transmission of the expected stimulus signal to the first type device-under-test. The method further includes simulating a functional operational environment for a second type device-under-test with the tester after testing the first type device-under-test.

In some implementations, a method is provided for simulating a functional operational environment in a reconfigurable automated tester. This includes configuring the reconfigurable automated tester to be capable of ascertaining an expected stimulus signal for transfer to a first type SOC device-under-test from a non-deterministic response signal based on a predetermined protocol for the first type SOC device-under-test, and reconfiguring the reconfigurable automated tester to be capable of ascertaining an expected stimulus signal for transfer to a second type SOC device-under-test from a non-deterministic response signal based on a predetermined protocol for the second type SOC device-under-test.

DESCRIPTION

Figure 1:
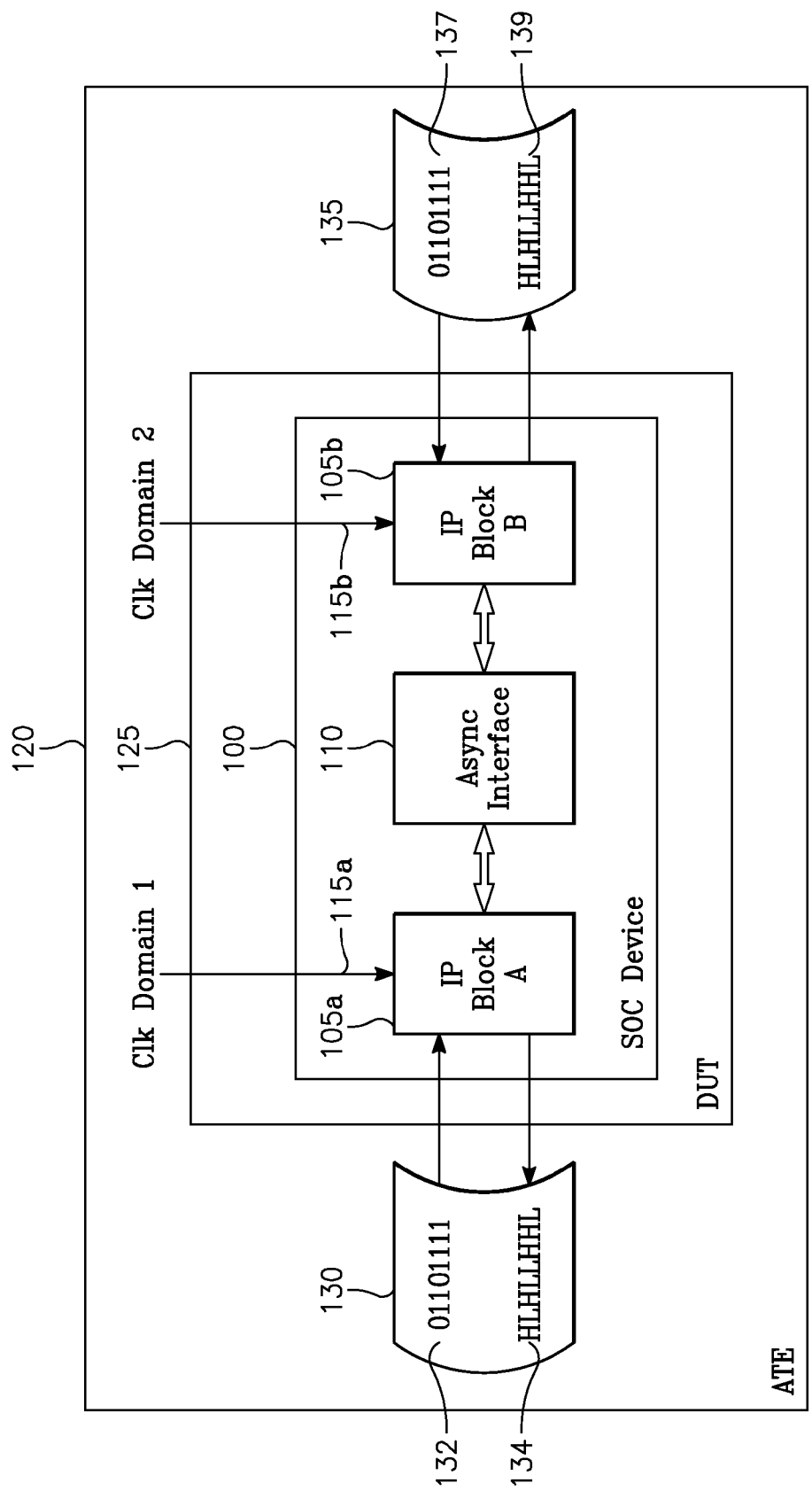
FIG. 1 is a block diagram of an integrated circuit device structure having a non-deterministic behavior.

As described above, in recent years stored pattern functional testing has run into increasing difficulties with devices that do not behave deterministically. Presently, the level of integration and complexity of semiconductor processing is allowing for integrated circuit chips to effectively be a complete "system-on-a-chip" (SOC). A system-on-a-chip integrates all the functional circuit elements of a computer or other electronic system into a single integrated circuit (chip). These integrated circuit elements may be any combination of digital circuits, analog circuits, random access memory, mixed analog and digital signal circuits, and often include radio-frequency functions. Referring to FIG. 1, the SOC devices has multiple intellectual property (IP) integrated circuit element blocks 105a and 105b. In the present illustration, only two of the IP blocks 105a and 105b are shown for ease of explanation, but it is apparent to one skilled in the art that large numbers of complex IP blocks are integrated on an SOC device 100. In this illustration, the two IP blocks communicate through an asynchronous interface 110.

When the SOC device 100 is tested to determine parametric and functional operation, the SOC device 100 is placed in a device-under-test fixture 125 and connected through pin electronics to the automated test equipment system 120. The pin electronics provides the electrical interface between the device-under-test and automated test equipment system 120.

The automated test equipment system 120 generates, transmits, receives, and evaluates sets of test patterns 130 and 135 to determine the parametric and functional operation of the SOC device 100.

Each of the IP blocks 105a and 105b generally has its own clock and timing domains 115a and 115b that are generally not synchronized. The test stimulus signal 132 may cause the IP block 105a to communicate with the IP block 105b, which will cause the test response signal 139 of the IP block 105b to be incorrect. Similarly, the test stimulus signal 137 may cause the IP block 105b to communicate with the IP block 105a, which will cause the test response signal 134 of the IP block 105a to be incorrect. This nondeterministic communication will vary between SOC devices 100 and within the same SOC device 100 at different voltages and temperatures.

The current generation automated test equipment systems 120 are capable of providing the test stimulus signals 132 to the IP block 105a and the test stimulus signals 137 to the IP blocks 105b and receiving the test response signals 134 from the IP blocks 105a and the test response signals 139 from the IP blocks 105b. In this case the testing is deterministic in that the test response signals 134 and 139 match certain structures and timing to be valid. Any communication between the IP blocks 105a and 105b is curtailed and the interaction is not verified.

The current generation automated test equipment systems 120 have very limited capability to deal with non-deterministic SOC devices 100 other than provide to certain latency factors. This causes the test engineer significant problems, in that the first prototyped devices, more than likely, will not work when the test stimulus signals 132 and 137 are the simulation vectors used in the design verification. A series of trial and error loops ensues in which the test engineer tries to move vectors around until he finds a passing arrangement. Due to the large volume of data involved and the need to re-simulate every trial, each loop may take days, the net result being months added to the test and evaluation phase of a new SOC device.

In all probability, the test engineer may never find a single set of test stimulus signals 132 and 137 that works for all devices and may be faced with supporting many sets of the test stimulus signals 132 and 137. In this situation, if any one passes, the device is deemed good. This causes a test time penalty for having to support many patterns and there is a very real possibility that not all possible good patterns will have been discovered, thus creating an adverse yield impact.

In this situation, months can be added to time to market and device yields may be reduced. Some organizations have chosen to address the inability to cope with the nondeterministic functioning of the IP blocks 105a and 105b within a SOC device 100 by moving away from functional testing on an automated test equipment system 120 entirely using some form of structural test. While structural test is a necessary ingredient of a successful test plan, it is not sufficient in the present era of semiconductor processing with current geometries.

To solve the problem of device non-determinism to permit use of automated test equipment systems 120, an embodiment of an automated test equipment systems 120 includes a protocol specific circuit for simulating a functional operational environment into which an SOC device 100 to be tested is placed for functional testing. The protocol specific circuit is aware of the protocol that the IP blocks 105a and 105b are communicating. The basic problem caused by non-determinism is that while the SOC device 100 may end up doing the same thing each time, it doesn't necessarily do it the same way each time. It may want data presented a cycle earlier or later than the last time it ran. An obvious solution to this behavior is, rather than simply spewing data at the SOC device 100, to wait until the device is ready for it. In order to wait until the SOC device 100 is ready, however, the automated test equipment system 120, in some sense, understands the function of the test response signals 134 and 139 from the SOC device 100.

To keep up with increasing SOC device 100 speeds, current automated test equipment systems 120 have increased the pipeline depth of the pattern generators. This has allowed the use of low cost CMOS technology for all but the last few transistors in the automated test equipment system 120 channel, yet has permitted speeds in excess of 6.4 Gbps, with patterns that approach Gigabit depth, to be achieved. A side effect of this trend is that if the pattern flow of the automated test equipment system 120 needs to be changed in order to respond to the device, there may be a latency of several microseconds to clear the pipeline.

A protocol aware circuit is placed as close as possible to the device-under-test fixture 125 and thus to the SOC device 100 to receive the non-deterministic test response signals 134 and 139 communicated by a SOC device 100 through the device-under-test fixture 125. The protocol aware circuit controls a transfer of test stimulus signals 132 and 137 to the SOC device 100 in response to non-deterministic test stimulus signals 132 and 137.

Figure 2:
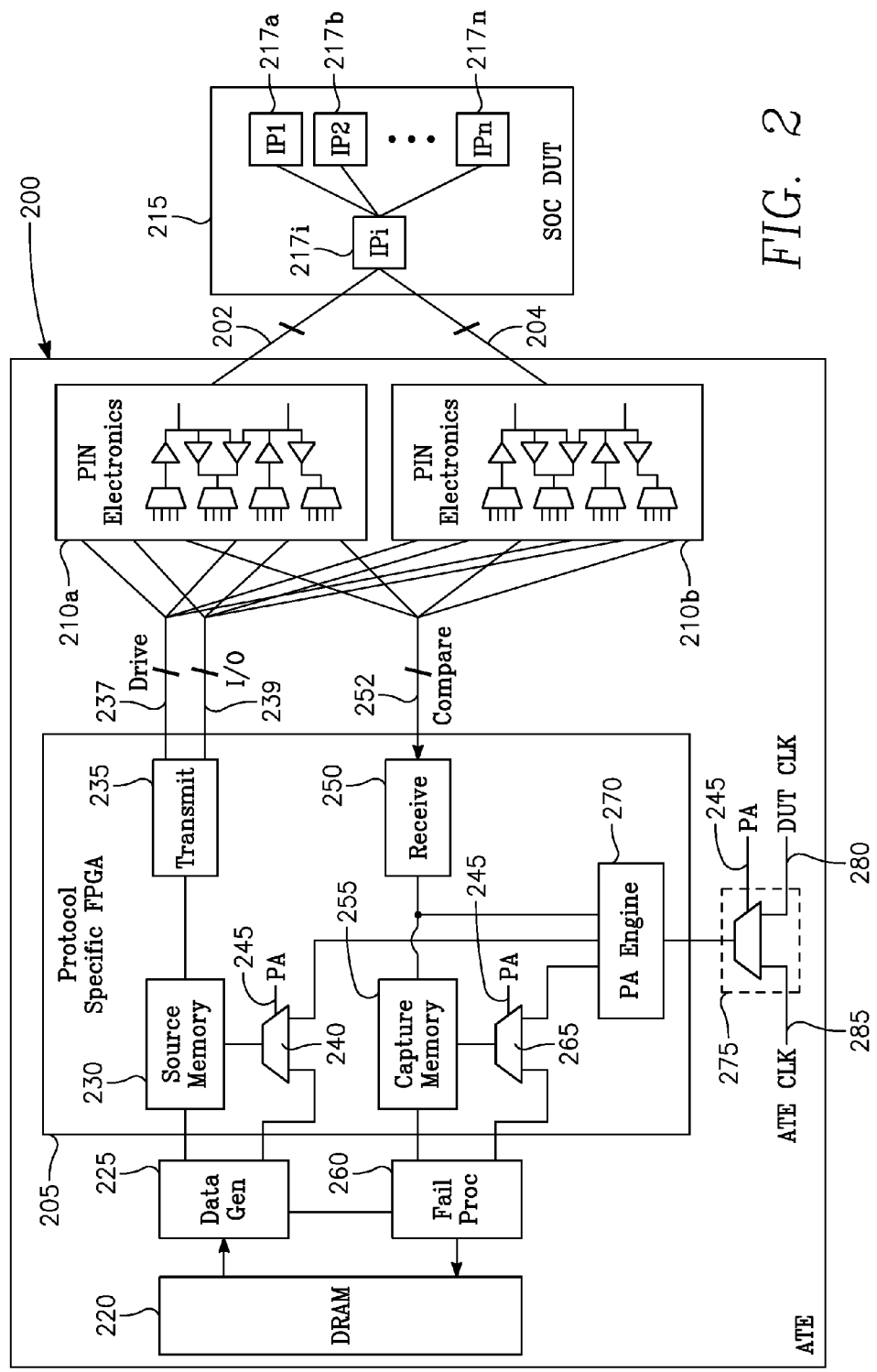
FIG. 2 is a block diagram of an embodiment of a protocol specific circuit within an automatic test equipment system.

Refer now to FIG. 2 for a detailed explanation of the protocol specific circuit 205 within an embodiment of an automated test equipment system 200. A data generator 225 creates the test stimulus signals from the test pattern commands stored in the Dynamic Random Access Memory (DRAM) 220. The test stimulus signals are transferred to the source memory 230 of the protocol specific circuit 205 which acts to speed match the test stimulus signals to the specifications of the SOC device-under-test 215.

Ideally, the source memory 230 is a random access memory (RAM) that allows the random access of the test stimulus signals. In a true RAM mode, it may not be necessary to provide test vectors for operation, the DUT can write data in and then read the data out when requested. The RAM typically works for speeds below around 1 GHz and port pin counts up to 128 pins, in current technology. However, because of the performance requirements of the SOC device-under-test 215 with faster speeds or wider busses, the source memory 230 may be a First-In-First-Out (FIFO) memory where the test stimulus signals are ordered and transferred at the required speed. It should be noted, that either/both the FIFO and true RAM mode (in addition to other protocols) are supported in various embodiments.

The output of the source memory 230 is sent to a transmission buffer circuit 235 that amplifies and conditions the test stimulus signals for transfer on the physical interconnections 237 and 239 to the pin electronics 210*a* and 210*b*. The pin electronics 210*a* and 210*b* provides the electrical interface 202 and 204 between the SOC device-under-test 215 and the automated test equipment system 200. In normal deterministic operation, the test stimulus signals are transferred at determined times and with a determined structure based on the test vectors stored in the DRAM 220. The test stimulus signals are applied to the desired IP block 217*i* of the IP blocks 217*a*, 217*b*, . . . , 217*i*, . . . and 217*n* that populate the SOC device-under-test 215.

In the deterministic operation mode, the IP block 217*i* responds with the test response signals on the interface 204 to the pin electronics 210*a* and 210*b*. The pin electronics 210*a* and 210*b* then transfer the test response signals on the interface 252 to the receiver 250. The receiver 250 amplifies and conditions the test response signals and transfers them to the capture memory 255. The capture memory 255 acts to buffer the test response signals for transfer from the protocol specific circuit 205 to the failure processor 260. The capture memory 255 is generally a FIFO memory where the ordered test response signals are transferred at the required speed.

The failure processor 260 receives the test response signals from the capture memory 255 and the test stimulus signals from the data generator 225 for comparison. Any of the test response signals that are incorrect are logged to the DRAM 220 for further analysis.

The deterministic operation mode of the automated test equipment system 200 as described provides the deterministic operation as in the automated test equipment systems of the prior art. The protocol specific circuit 205 has mode selection circuits 240 and 265 that switch from the deterministic operation mode to the non-deterministic operation mode based on the state of the protocol aware selection signal 245. For the deterministic operation mode, as just described, the protocol aware selection signal 245 is set such that the mode selection circuit 240 has the control of the source memory 230 from the data generator 225 and the mode selection circuit 265 has the control of the capture memory 255 from the failure processor 260. In the non-deterministic operation mode, the protocol aware selection signal 245 is set such that the control of the source memory 230, and the capture memory 255 is from a protocol aware engine 270.

The protocol aware engine 270 may be a reconfigurable integrated circuit such as for example a field programmable gate array (FPGA) that is reconfigured to accept a protocol from the SOC device-under-test 215, decode the protocol into a command, address, and/or data. From the received command, address, timing, and/or data, the protocol aware engine 270 determines the structure and the timing of the test stimulus signals that are to be transferred from the source memory 230 to the IP block 217*i* through the transmitter 235 and the pin electronics 210*a* and 210*b*. For example, if the automated test equipment system 200 is to stimulate random access memory (RAM) and the IP block 217*i* of the SOC device-under-test 215 is a memory controller, the memory controller 217*i* sends test response signals that when decoded are the address, command, control, timing, and data for a RAM. The protocol aware engine 270 receives test response signals and decodes the test response signals into the address, command, control, timing, and data. The protocol aware engine 270 determines the structure and timing of the test stimulus signals that are to be supplied to the IP block 217*i* of the SOC device-under-test 215. In the case of a read command of the RAM, the protocol aware engine 270 determines the read latency timing and the structure of the data to be transferred and commands the source memory 230 to transfer the test stimulus signals accordingly. In the case of the write, the protocol aware engine 270 decodes the address and commands from the capture memory 255 to store the written data. The protocol aware engine 270 also initiates any response acknowledging the write as a test stimulus signal to the IP block 217*i*. In this action, any of the IP blocks 217*a*, 217*b*, . . . , and 217*n* that are being tested will interact with the IP block 217*i* in a functionally correct manner as though the SOC device-under-test 215 were in its standard operating environment.

It should be noted that the source memory 230 and the capture memory 255 could be random access memories such as a static RAM or dynamic RAM. However, in simulating the operating environment of a high performance SOC device-under-test 215, the source memory 230 and the capture memory 255 may be First-In-First-Out (FIFO) memories.

The FIFO memories by their nature allow faster transfer and receipt of the test stimulus signals than do the static and dynamic RAM's.

To assure appropriate synchronicity of the transfer of the test response signals, the protocol aware engine 270 may optionally be clocked by the Device-Under-Test clock 280 during the non-deterministic mode of operation and the automated test equipment system 200 clock 285 for deterministic operation. The automated test equipment system 200 clock 285 may be optionally selected when automated test equipment system 200 is initiating the non-deterministic operation, as a master, and is thus the source of the clock. The optional multiplexer 275 is controlled by the aware selection signal 245 to control the operational mode of the protocol aware engine 270 between the deterministic and the non-deterministic modes.

The protocols that various embodiments of the automated test equipment system 200 may be required to simulate fall generally into two broad categories. In a first example, the SOC device-under-test 215 controls the interface between automated test equipment system 200 and the SOC device-under-test 215. In a second example, the automated test equipment system 200 controls the interface between the SOC device-under-test 215 and the automated test equipment system 200. In the first example, the SOC device-under-test 215 communicates the non-deterministic signal and the automated test equipment system 200 responds. In the second example, the automated test equipment system 200 sends the test stimulus signals with the appropriate protocol structure and timing to the SOC device-under-test 215 and the SOC device-under-test 215 responds with the non-deterministic test response signals that are decoded, as described above. In either example, the automated test equipment recognizes a non-deterministic response signal from the SOC device-under-test and responds.

Figure 3:
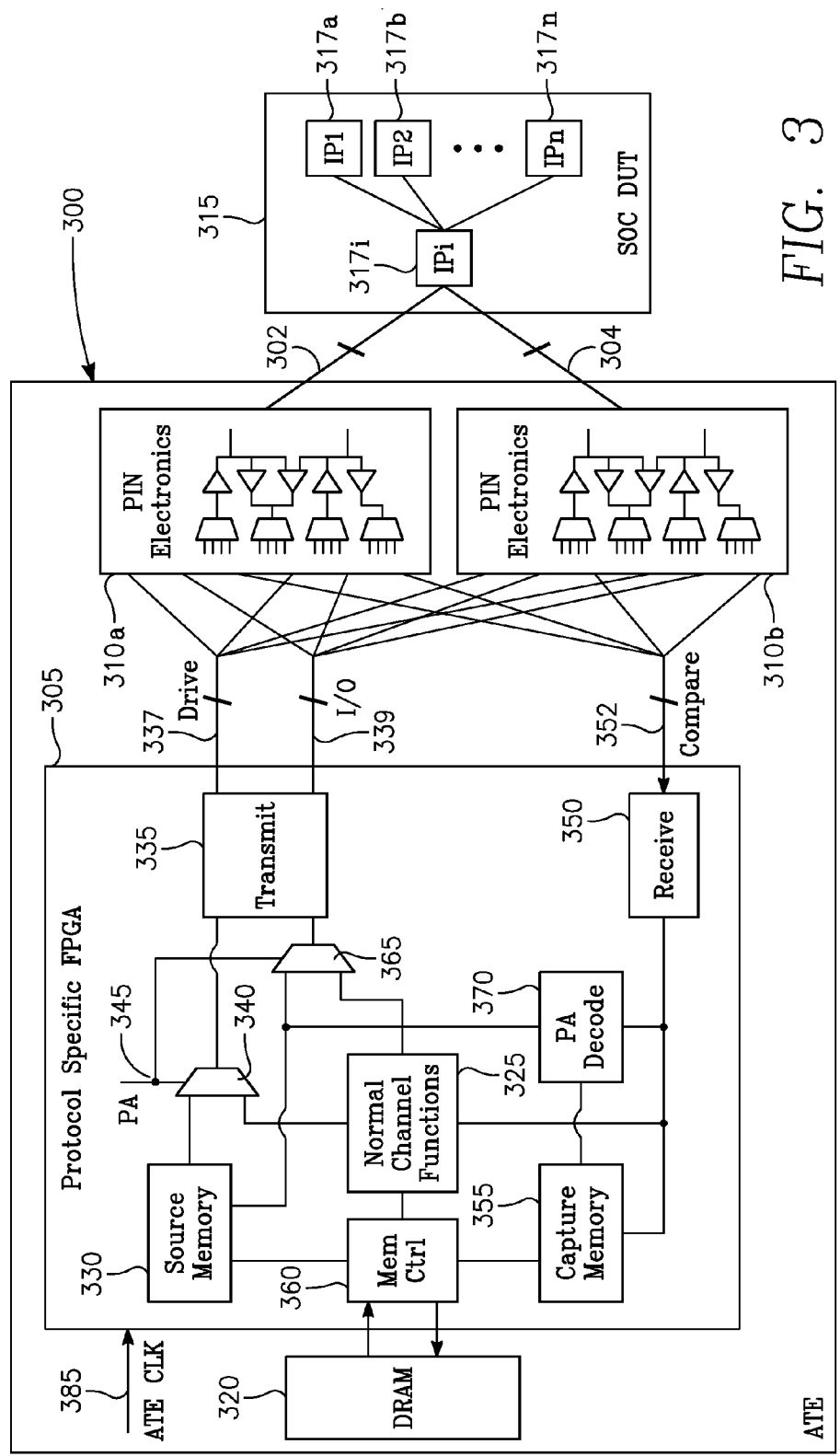
FIG. 3 is a block diagram of another embodiment an automatic test equipment system incorporating one embodiment of a protocol specific circuit.

Refer now to FIG. 3 for a detailed explanation of another embodiment of a protocol specific circuit 305 within an automated test equipment system 300. The protocol specific circuit 305 has a channel function generator 325 that creates the test stimulus signals from the test pattern commands stored in the Dynamic Random Access Memory (DRAM) 320. The channel function generator 325 communicates with the memory controller 360 to retrieve the test pattern commands from the DRAM 320. The memory controller 360 generates the necessary address, timing, and command signals for accessing the test pattern commands from the DRAM 320. The memory control 360 receives the test pattern commands and transfers them to the channel function generator 325. The test pattern commands are then decoded to form the test stimulus signals. The test stimulus signals are then transferred to the through the mode selection circuits 340 and 365 to the transmission buffer circuit 335. The transmission buffer circuit 335 amplifies and conditions the test stimulus signals for transfer on the physical interconnections 337 and 339 to the pin electronics 310a and 310b. The pin electronics 310a and 310b provides the electrical interface 302 and 304 between the SOC device-under-test 315 and the automated test equipment system 300. In normal deterministic operation, the test stimulus signals are transferred at determined times and with a determined structure based on the test vectors stored in the DRAM 320. The test stimulus signals are applied to the desired IP block 317i of the IP blocks 317a, 317b, . . . , 317i, . . . and 317n that populate the SOC device-under-test 315.

In the deterministic operation mode, the IP block 317i responds with the test response signals on the interface 304 to the pin electronics 310a and 310b. The pin electronics 310a and 310b then transfer the test response signals on the interface 352 to the receiver 350. The receiver 350 amplifies and conditions the test response signals and transfers them to the capture memory 355. The capture memory 355 acts to buffer the test response signals for transfer to the memory controller 360 and the channel function generator. The capture memory 355 is generally a FIFO memory where the ordered test response signals are transferred at the speed dictated by the specification of the IP block 317i.

The channel function generator 325 receives and compares the test response signals and the test stimulus signals. Any of the test response signals that are incorrect are logged to the DRAM 320 through the memory controller 360 for further analysis.

The deterministic operation mode of the automated test equipment system 300 as described provides the deterministic operation as in the automated test equipment systems of the prior art. The mode selection circuits 340 and 365 switch from the deterministic operation mode to the non-deterministic operation mode based on the state of the protocol aware selection signal 345. For the deterministic operation mode, as just described, the protocol aware selection signal 345 is set such that the channel function generator 325 controls the transfer of the test stimulus signals from the channel function generator 325. In the non-deterministic operation mode, control of the source memory 330, and the capture memory 355 is from a protocol decode circuit 370. The transmission of the test stimulus signals is transferred from the channel function generator 325 to the protocol decode circuit 370.

The protocol decode circuit 370 may be a reconfigurable integrated circuit such as a field programmable gate array (FPGA) that is configured to accept a protocol from the SOC device-under-test 315, decode the protocol into a command, address, and/or data. From the received address, command, control, timing, and data, the protocol decode circuit 370 determines the structure and the timing of the test stimulus signals defined by the specification of the IP block 317i. The protocol decode circuit 370 communicates with the source memory 330 which extracts the necessary test stimulus signals from the DRAM 320 through the memory controller 360. The test stimulus signals are transferred through the mode selection circuit 340 from the source memory 330 and those test stimulus signals that represent command responses to the IP block 317i are transferred through the mode selection circuit 365. The test stimulus signals are transferred through the interconnections 337 and 339 to the pin electronics 310a and 310b to the IP block 317i of the SOC device-under-test 315. For example, if the automated test equipment system 300 is to stimulate random access memory (RAM) and the IP block 317i of the SOC device-under-test 315 is a memory controller, the memory controller sends test response signals that when decoded are the address, command, control, timing, and data for a RAM. The protocol decode circuit 370 receives test response signals and decodes the test response signals into the address, command, control, timing, and data. The protocol decode circuit 370 determines the structure and timing of the test stimulus signals that are to be supplied to the IP block 317i of the SOC device-under-test 315. In the case of a read command of the RAM, the protocol decode circuit 370 determines the read latency timing and the structure of the data to be transferred and commands the source memory 330 to transfer the test stimulus signals accordingly with the protocol decode circuit 370 providing any of the specified command and timing response signals for the memory controller of the IP block 317i.

In the case of the write, the protocol decode circuit 370 decodes the address and commands the capture memory to store the written data. The protocol decode circuit 370 also initiates responses acknowledging the write as a test stimulus signal to the IP block 317*i* through the mode selection circuit 365, the transmission circuit 335 and the pin electronics 310*a* and 310*b*. In this action, any of the IP blocks 317*a*, 317*b*, ..., and 317*n* that are being tested will interact with the IP block 317*i* in a functionally correct manner as though the SOC device-under-test 315 were in its standard operating environment.

It should be noted that the source memory 330 and the capture memory 355 are ideally a random access memories such as a static RAM or Dynamic RAM. However, in simulating the operating environment of a high performance SOC device-under-test 315, the source memory 330 and the capture memory 355 may be First-In-First-Out (FIFO) memories. The FIFO memories by their nature allow faster transfer and receipt of the test stimulus signals than do the Static and Dynamic RAM's. Further, in this embodiment the source memory 330, the capture memory 355, and the mode selection circuits 340 and 365 are also reconfigurable circuits within an FPGA.

While this embodiment is shown with a single ATE clock 385 for the protocol specific circuit 305, the protocol specific circuit 305 may optionally be clocked by the Device-Under-Test clock during the non-deterministic mode of operation and by the automated test equipment system clock 385 during the deterministic mode to assure appropriate synchronicity of the transfer of the test response signals. An optional multiplexer (not shown) similar to the optional multiplexer 275, as shown in FIG. 2, may be provided to switch between the Device-Under-Test clock and the automated test equipment system clock 385. The optional multiplexer is controlled by the protocol aware selection signal 345 to control the operational mode of the protocol specific circuit 305 between the deterministic and the non-deterministic modes.

The embodiments of FIGS. 2 and 3 of the automated test equipment system show a single protocol aware channel that includes the protocol specific circuit. In conventional automated test equipment system, there are multiple channels with each channel controlling the stimulus and response for a specific number of pins (i.e. 8 pins) of the SOC device-under-test. The multiple protocol aware channels of the automated test equipment system of some embodiments communicate with other protocol aware channels to decode protocol commands from the SOC device-under-test and then generate and synchronize the test stimulus signals that are the correctly structured and timed responses expected by the SOC device-under-test.

Figure 4:
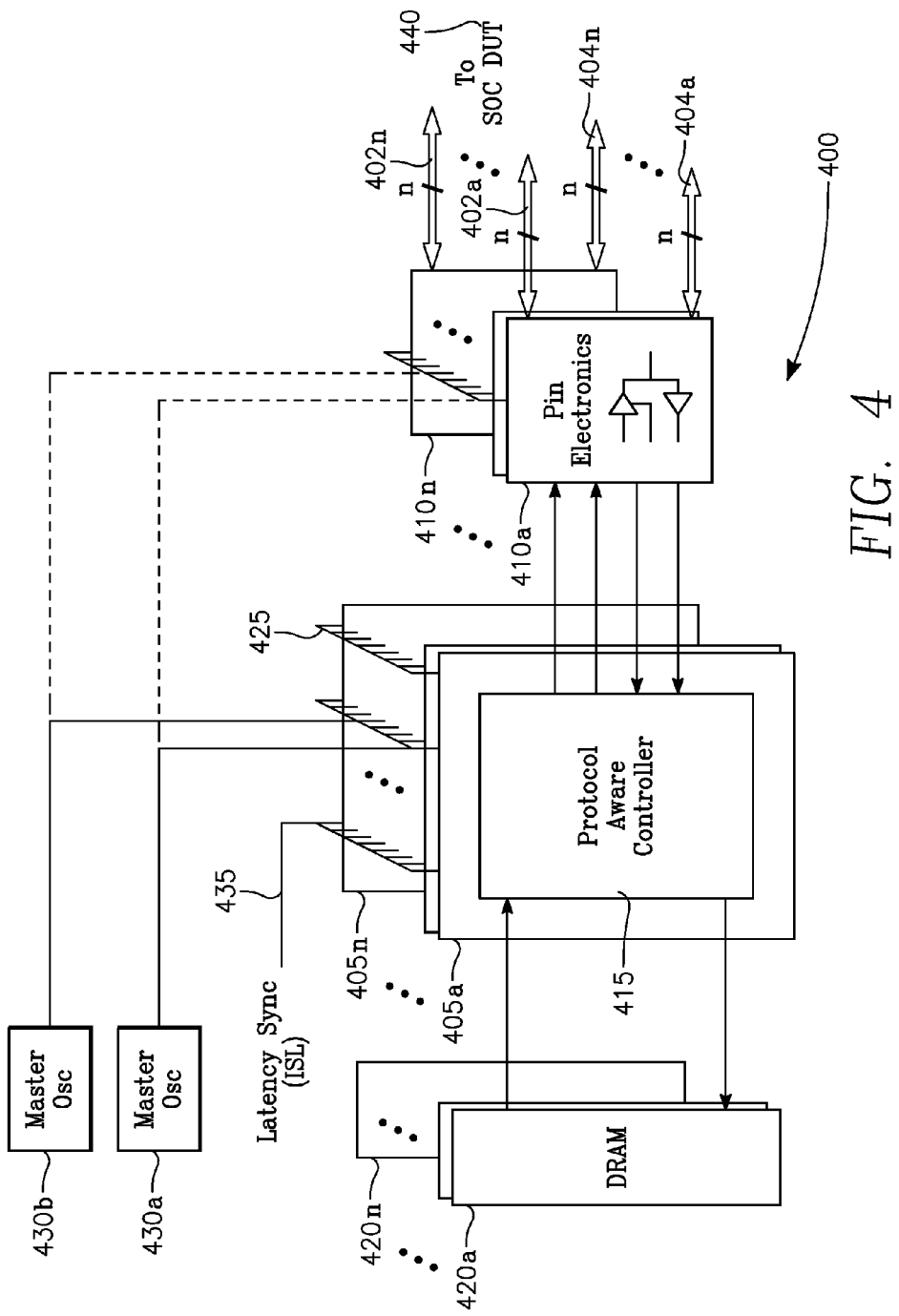
FIG. 4 is a block diagram of an automatic test equipment system incorporating multiple instances of one of the embodiments of the protocol specific circuits.

Refer now to FIG. 4 for a description of the automated test equipment system 400 of this embodiment. The automated test equipment system 400 has multiple channels of the protocol specific circuits 405*a*, ..., 405*n* that are connected to multiple pin electronic units 410*a*, ..., 410*n*. Each of the multiple pin electronic units 410*a*, ..., 410*n* as described above provide the electrical interface 402*a*, ..., 402*n* and 404*a*, ..., 404*n* between the SOC device-under-test 440 and the automated test equipment system 400 through the physical interconnections of the load adapter. Each of the protocol specific circuits 405*a*, ..., 405*n* is connected to at least one of the multiple pin electronic units 410*a*, ..., 410*n* to provide the test stimulus signals to and receive the test response signals from the SOC device-under-test 440.

Each of the protocol specific circuits 405*a*, ..., 405*n* has a protocol aware controller 415 which functions as the protocol aware engine 270 of FIG. 2, or the protocol decode circuit 370 of FIG. 3, in coordination with the remaining circuitry of the protocol specific circuit 205 of FIG. 2 or the protocol specific circuit 305 of FIG. 3. Each protocol aware controller 415 of the protocol specific circuits 405*a*, ..., 405*n* communicates with its designated DRAM 420*a*, ..., 420*n* to provide the necessary test commands and to log the test results of the exercising of the SOC device-under-test 440.

In protocols that have a large number of pins, the protocol specific circuits 405*a*, ..., 405*n* coordinate the decoding of the commands and generate the test response signals that simulate the expected responses synchronously. To simulate the expected responses synchronously, the protocol specific circuits 405*a*, ..., 405*n* communicate through a synchronization communication interface 425 between those of the protocol specific circuits 405*a*, ..., 405*n* that may cooperate. This cooperation may effect the latency of the operation and thus the communication is structured to minimize the impact of the cross communication between the protocol specific circuits 405*a*, ..., 405*n*. For instance one of the protocol aware controllers 415 may act as a master and receive the test stimulus signals directly from adjacent protocol specific circuits 405*a*, ..., 405*n* for decoding. The master protocol aware controller 415 then dispatches the appropriate instructions for constructing the structure and timing of the test response signals specified by the protocol, while minimized the impact of the latency for the operation. The latency synchronization signal line (ISL) 435 is used by the master protocol aware controller 415 for dispatching the initiation of a particular protocol action across multiple protocol specific circuits 405*a*, ..., 405*n*.

The automated test equipment system 400 may have multiple master oscillators 430*a* and 430*b* to generate the different timings determined by the protocol specific circuits 405*a*, ..., 405*n*. This is true especially for the deterministic operation of the automated test equipment system 400. In the non-deterministic operation of the automated test equipment system 400, the master oscillators 430*a* and 430*b* may be used for those portions of the testing involving deterministic operation while an exterior timing from the SOC device-under-test 440 may be used for the protocol aware controller 415 in non-deterministic operation.

Figure 5A:
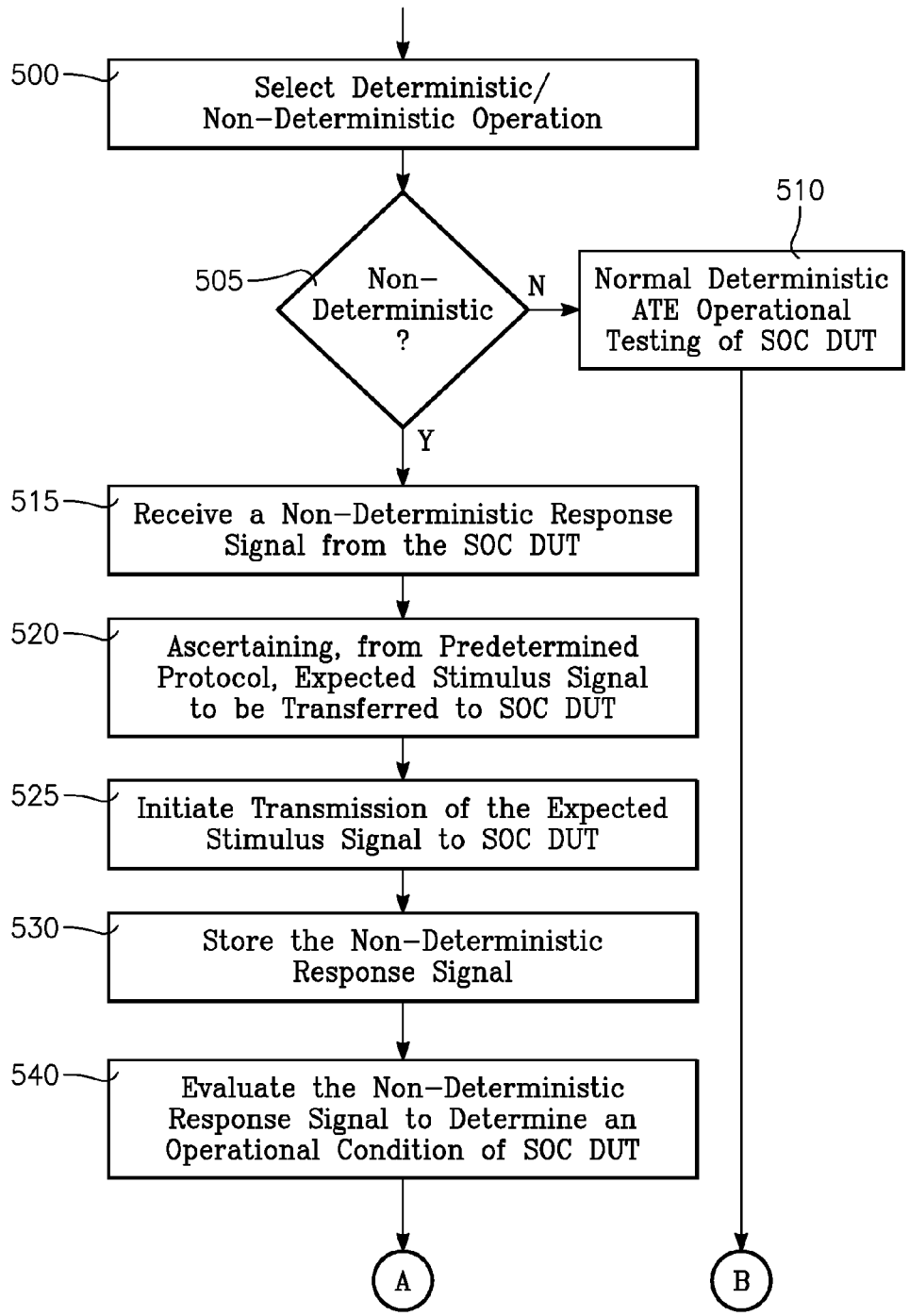
FIGS. 5a and 5b are flow diagrams of a method for simulating within an automatic test system a functional operational environment into which a device-under-test is placed for functional testing.
Figure 5B:
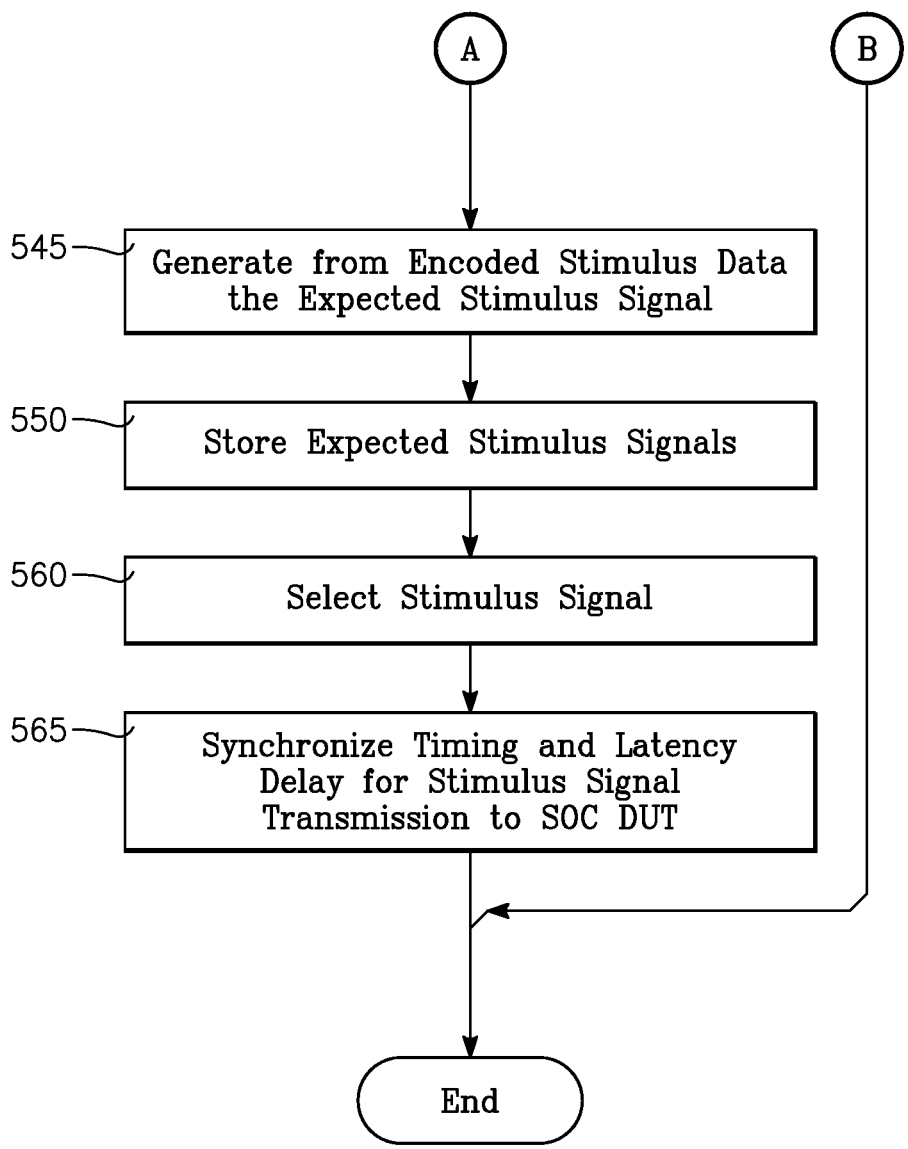

Refer now to FIGS. 5*a* and 5*b* for a description of a method for simulating within an automatic test system a functional operational environment into which a device-under-test is placed for functional testing. The device-under-test is an SOC integrated circuit that is placed in an adapter (or load) board, i.e. a DIB. The pin electronics provides the electrical interface, via the DIB, between the device-under-test and the test circuitry of the automatic test system. The method begins by (Box 500) selecting the mode of operation of the automatic test system. If the deterministic mode of operation is determined (Box 505) to be selected, the normal operational testing of the SOC DUT is performed (Box 510). If the non-deterministic mode is determined (Box 505) to be selected, a non-deterministic response signal is received (Box 515) from the SOC device-under-test. Based on a predetermined protocol, an expected stimulus signal to be transferred to the SOC DUT is ascertained (Box 520) from the non-deterministic response signal. Transmission of the expected stimulus signal from the automatic test system to the device-under-test is initiated (Box 525). The non-deterministic response signal is stored (Box 530) within a response capture storage device. The non-deterministic response signal is evaluated (Box 540) to determine if the non-deterministic response signal was correctly transmitted from the SOC DUT to determine an operational condition of the SOC DUT.

Expected stimulus signals are generated (Box 545) from an encoded stimulus data and stored (Box 550) in an expected stimulus signal storage device. At least one of the expected stimulus signals is selected (Box 560). From the decoded non-deterministic response signal, the timing and latency delay of the expected stimulus signal is synchronized (Box 565) for transmission to the SOC DUT.

The predetermined protocols of the non-deterministic response signals and the expected stimulus signals may be a random access memory interface protocol, a communication interface protocol, or computing device interface protocol.

The decoding of the non-deterministic response signal permits the automatic test system to transfer an expected response to the SOC DUT by the expected stimulus signals with the appropriate timing and latency delays that would be expected in the normal operating environment of the SOC DUT.

Figure 6:
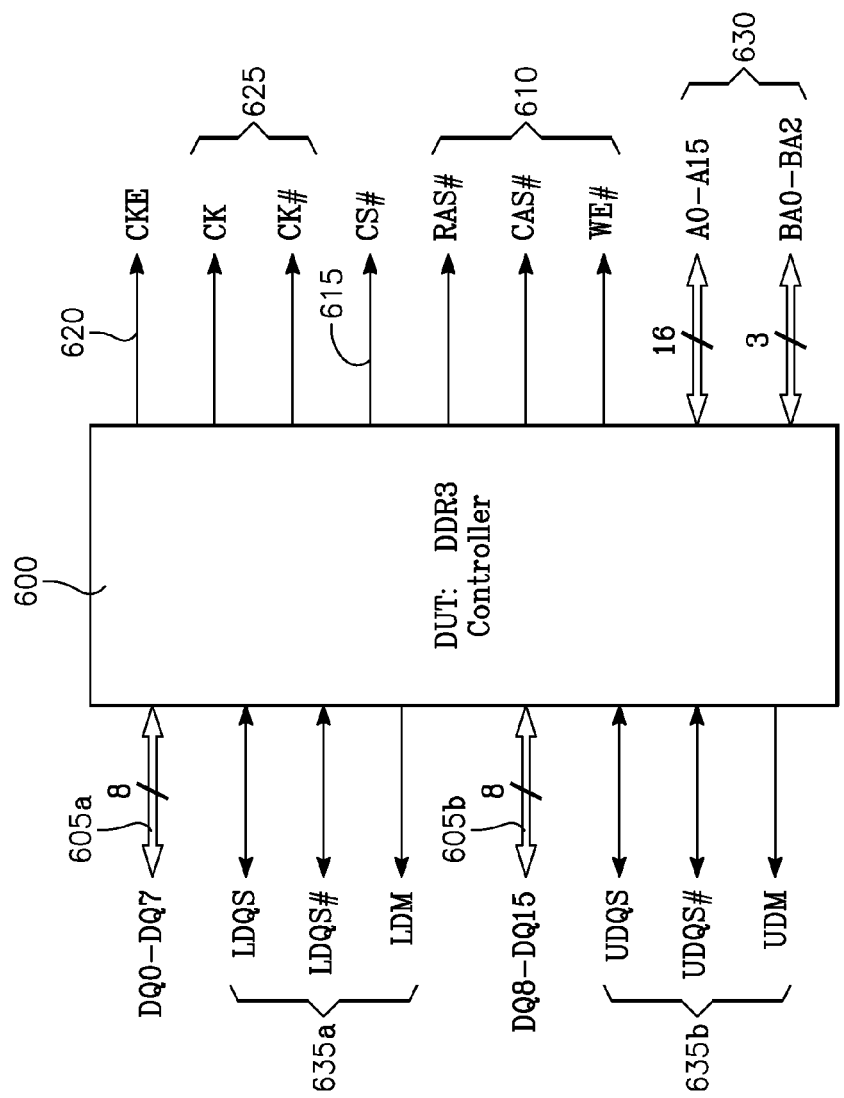
FIG. 6 is a block diagram illustrating a Double Data Rate Random Access Memory Controller protocol, which some embodiments of the protocol specific circuit may simulate.

The "JEDEC Standard JESD79-3-DDR3 SDRAM Standard", JEDEC Solid State Technology Association, Arlington, Va., June 2007, defines the Double Data Rate (DDR3) Synchronous Dynamic Random Access Memory (SDRAM) specification, including features, functionalities, AC and DC characteristics, packages, and ball/signal assignments. One of the IP blocks of a SOC DUT, as described above, may be a controller circuit for a memory system containing DDR3 SDRAM. In a functional evaluation of the IP block of the SOC DUT, other IP Blocks may be requesting transfer of data between the controller circuit IP block and the memory system. In a test environment this type of access is not deterministic, but is based on the timing of the interactions between the IP blocks. The controller IP Block will activate the timing, command, control, and data signals to transfer data between the DDR3 SDRAM and the SOC DUT. The automated test equipment system of various embodiments responds with the appropriate signals at the specified timings and structure for the controller IP block to correctly interact with the remaining IP Blocks of the SOC DUT. As noted the timing of this interaction is non deterministic and is accomplished according to the specifications of the protocol. Referring to FIG. 6, the controller IP block 600 generates the data signals 605*a* and 605*b*, the command signals (RAS#, CAS#, and WE#) 610, the select and enable signals 615 and 620, the clocking signals (CK and CK#) 625, the address signals, 630, and the strobe and synchronizing signals 635*a* and 635*b* as defined in the DDR3 SDRAM Standard.

The protocol aware controller of various embodiments receives the signals, decodes the action, execute the commands to perform the requested action. The protocol controller then times and synchronizes the test stimulus signals that simulate the DDR3 SDRAM responses so that they arrive at the SOC DUT with a consistent Clock Latency (CL). The non-operational (NOP) cycles need to be captured and compared. The stripping out NOP cycles reduces the data set size used by the automated test equipment system of the various embodiments and is one of the immediate benefits of the protocol aware controller within the automated test equipment system of the various embodiments.

As can be seen from this example, the DDR3 SDRAM protocol includes a total of 26 Address/Command/Clocking pins (610, 615, 620, 625, and 630) and another 22 Data/Mask/Strobe pins (605*a*, 605*b*, 635*a*, and 635*b*) that are to be observed. A total of 48 channels are employed within the automated test equipment system of this embodiment to simulate the DDR3 SDRAM function. If each of the protocol aware controllers controls a total of eight channels, with at least six of the protocol aware controllers cooperatively linked to simulate the DDR3 SDRAM to test the functional operation of the controller IP block 600.

Figure 7:
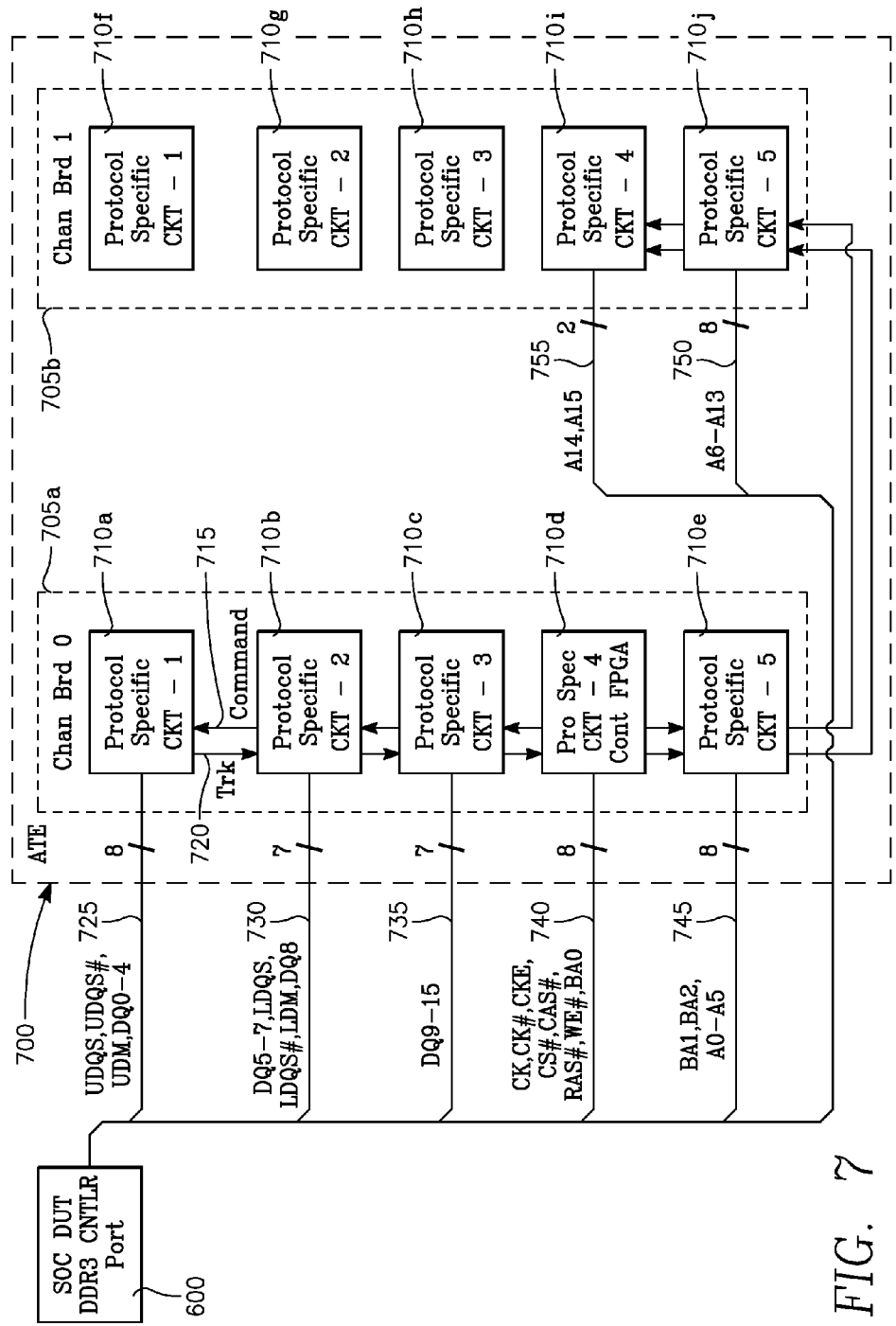
FIG. 7 is a block diagram of one embodiment of the protocol specific circuits within an automatic test equipment system configured to simulate the Double Data Rate Random Access Memory Controller protocol of FIG. 6.

Refer now to FIG. 7 for a description of the channel structure of the automated test equipment system 700. The automated test equipment system 700 has a number of channel boards 705*a* and 705*b* (2 in this example). Each of the channel boards 705*a* and 705*b* has a number (5 in this example) of protocol specific circuits 710*a*, . . . , 710*e*, and 710*f*, . . . , 710*j*. Each of the protocol specific circuits 710*a*, . . . , 710*e*, and 710*f*, . . . , 710*j* is capable of decoding, controlling, and synchronizing a number of input and output signals, in this example eight (8). The channel layout for the automated test equipment system 700 is designed to accommodate the protocol of the DDR3 SDRAM from the DDR3 SDRAM controller IP block 600. Certain restrictions for the protocol is observed for these channels of the protocol specific circuits 710*a*, . . . , 710*e*, and 710*f*, . . . , 710*j* that are related to tracking. The DDR3 SDRAM timing is specified relative to either the timing clocks (CK) or the data strobes (DQS), the tracking function of the protocol specific circuits 710*a*, . . . , 710*e*, and 710*f*, . . . , 710*j* are employed to ensure that the appropriate timing and synchronization criteria is met. The Address/Command channels 740, 745, 750, and 755 will follow the clocking channel 740 and the Data and Mask channels 725, 730, and 735 will follow their respective data strobe pins 725 and 730.

Since the results of the decoded address, command, control, timing, and data signals of a protocol are communicated between the protocol specific circuits 710*a*, . . . , 710*e*, and 710*f*, . . . , 710*j*, the tracking signals 720 and command signals 715 are connected to transfer the necessary tracking signals between the protocol specific circuits 710*a*, . . . , 710*e*, and 710*f*, . . . , 710*j*. In the case of the DDR3 SDRAM protocol, the clock timing and command signals 740 and the data strobe (DQS) 725 and 730 are tracked and transferred to the other protocol specific circuits 710*a*, . . . , 710*e*, and 710*f*, . . . , 710*j*.

It should be noted that in most cases all or most of the channels (8) of the protocol specific circuits 710*a*, . . . , 710*e*, and 710*f*, . . . , 710*j* are used, but in two of the cases, the channels are only partially used (7). This is because the tracking function is split on even channel boundaries for the case of tracking a differential signal such as the clock timing (CK) and the data strobe (DQS) signals that are both diff signals. In each case, the channel boards 705*a* and 705*b* are designed such that the tracked signal is the first in a tracking chain followed by the dependent signals.

It should further be noted that the DDR3 SDRAM protocol spans more than the number of protocol specific circuits 710*a*, . . . , 710*e*, and 710*f*, . . . , 710*j* that populate the channel boards 705*a* and 705*b*. The tracking and command signals propagate from one channel board 705*a* and 705*b* to the other channel boards 705*a* and 705*b*. Backplane interface board signals exist in automated test equipment systems 700 to allow for this propagation.

One of the protocol specific circuits 710*a*, . . . , 710*e*, and 710*f*, . . . , 710*j* is designated as the control protocol specific circuit 710*d*. The control protocol specific circuit 710*d* receives the various timing and command signals (CK, CS, CAS, RAS, WE) 740 for the DDR3 SDRAM protocol. Because of the necessity for decoding the timing and command signals (CK, CS, CAS, RAS, WE) 740 appropriately and expeditiously, the timing and command signals (CK, CS, CAS, RAS, WE) 740 for any protocol are not split between the protocol specific circuits 710*a*, . . . , 710*e*, and 710*f*, . . . , 710*j*.

Three protocol specific circuits 710*f*, 710*g*, and 710*h* are not used for this implementation of the DDR3 SDRAM protocol. The three protocol specific circuits 710*f*, 710*g*, and 710*h* are optionally used to expand the data bus of the DDR3 SDRAM to 32 bits as opposed to the sixteen bits of the example. The three protocol specific circuits 710*f*, 710*g*, and 710*h* alternately are used as regular channels or used for an entirely different protocol for another of the IP blocks of the SOC DUT.

Figure 8:
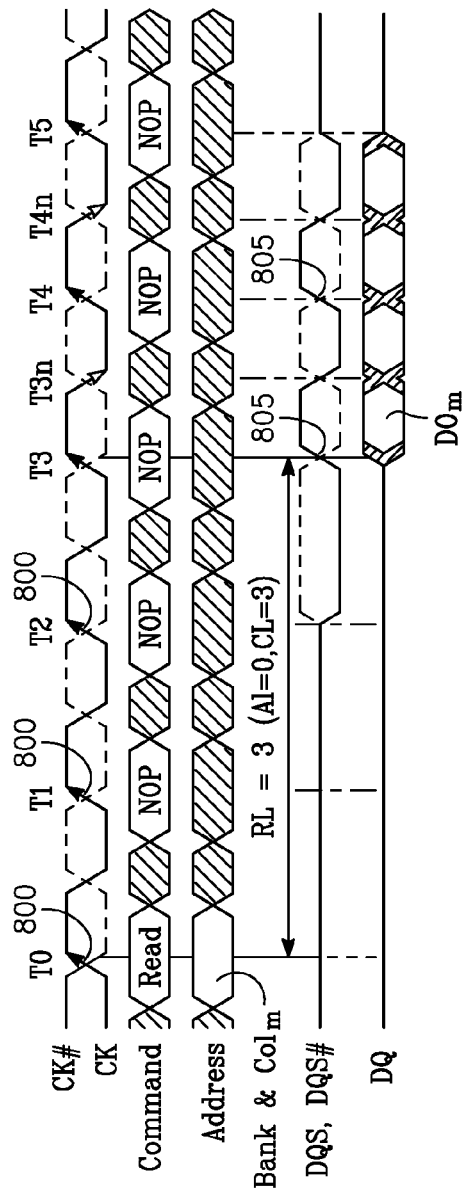
FIGS. 8 and 9 are plots respectively of the read and write timing of the Double Data Rate Random Access Memory Controller protocol as generated by one of the embodiments of the protocol specific circuits within an automatic test equipment system of FIG. 5.
Figure 9:
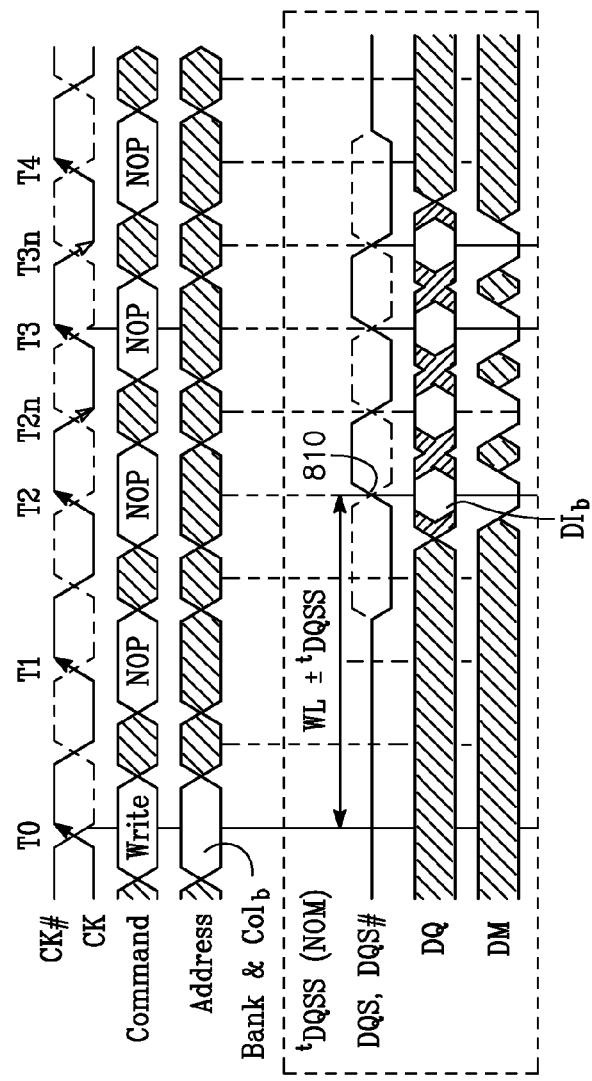

Refer now to FIGS. 8 and 9 for an examination of the timing characteristics of the DDR3 SDRAM Protocol. In FIG. 8 the rising edge 800 of clocking signal (CK) occurs in the middle of Command/Address signals when their signals are stable and valid. Alternately the rising edge 805 of data strobe signals (DQS) are sent out at the beginning of data signal (DQ) transfer time. A tracker or transition detector (not shown) monitoring the clock signals (CK/CK#) permits offset of the data strobe (DQS) from the tracker by 90 degrees in order to position the level transition of the data strobe (DQS) in the middle of the clock signal (CK) when the clock signal is not in transition. Additionally on the Address/Command Control protocol specific circuits, the data strobes are activated at the tracker time or alternately offset one complete clock signal (CK) cycle later in order to center the data strobes (DQS) at the center of the eye of the data signals (DQ). This will permit the "shmooing" or varying of the conditions and inputs of the data strobes (DQS) timings to determine the eye width to find the passing regions.

In the Write Cycle of FIG. 9, when the controller IP block is sourcing data, the position of data strobe (DQS) moves to the center of the data valid time 810. The tracking of the data strobes (DQS) allows the placement of the position of the data strobes (DQS) at the appropriate times 810 of the data signals (DQ).

The protocol specific circuits 710*a*, . . . , 710*e*, and 710*f*, . . . , 710*j* converts the controller IP block 600 clock phase to the tester clock phase (with the tracker). Some degree of drift between the protocol specific circuits 710*a*, . . . , 710*e*, and 710*f*, . . . , 710*j* clock and clocking and data strobe signals (CK and DQS) of the controller IP block 600. This allows generation of the clocks on the channel boards 705*a* and 705*b* without attempting to use the DDR3 SDRAM controller IP block 600 clock directly. The protocol specific circuits 710*a*, . . . , 710*e*, and 710*f*, . . . , 710*j* will be clocking data in/out of the protocol specific circuits 710*a*, . . . , 710*e*, and 710*f*, . . . , 710*j* at a slower rate (¼ the DDR3 SDRAM controller IP block 600 clock rate), so at least for the DDR3 SDRAM interface, the protocol specific circuits 710*a*, . . . , 710*e*, and 710*f*, . . . , 710*j* clock could be ¼ the rate of the clock signals (CK) (200 MHz max). To match the data rate of the DDR3 SDRAM Standard, the capture memory and the source memories of the protocol specific circuits 710*a*, . . . , 710*e*, and 710*f*, . . . , 710*j* may be paralleled FIFO memory that are read or written at the slower rate of the automated test equipment system while allowing the data to be transferred to the controller IP block 600 of the SOC DUT at its operational rate.

The internal clocking of the protocol specific circuits 710*a*, . . . , 710*e*, and 710*f*, . . . , 710*j* have two alternatives. One is to use the automated test equipment system clock to clock protocol specific circuits 710*a*, . . . , 710*e*, and 710*f*, . . . , 710*j*. Alternately, the clocking of the SOC DUT may be used for clocking the protocol specific circuits 710*a*, . . . , 710*e*, and 710*f*, . . . , 710*j*.

All DDR3 SDRAM Standard commands are defined by the state of the command signals (CS#, RAS#, CAS#, WE# and CKE) at the rising edge of clock signal (CK). Each unique command is present on any of the clock signal (CK) boundaries 800. There are limitations, however, on allowable command sequences. For example a READ or WRITE with Burst Length 4 cannot be interrupted until complete so that there is at least one NOP or DESELECT between consecutive READ/WRITE commands. A complete table of these constraints can be found in the DDR3 SDRAM Standard. It is optional that violations of these constraints be flagged but there is a subset of violations that will cause the protocol specific circuits 710*a*, . . . , 710*e*, and 710*f*, . . . , 710*j* to operate improperly (READ followed immediately by another READ for example). These will set an error flag and be logged as a fault in the controller IP block 600 of the SOC DUT.

There are only a limited number of actions the protocol specific circuits 710*a*, . . . , 710*e*, and 710*f*, . . . , 710*j* can perform on any given cycle:

1. Store (or compare to expected response) the Address/Command/WR Data into Capture memory;
2. Source Read Data from the source memory (READ FIFO); or
3. Do nothing.

A lookup table is resident in the DRAM of the protocol specific circuits 710*a*, . . . , 710*e*, and 710*f*, . . . , 710*j* for converting the command signal inputs (CS#, RAS#, CAS#, WE# and CKE) into the possible actions.

Various embodiments of the automated test equipment system will support many different protocols for the different SOC DUT. The correct protocol is configured in the three protocol specific circuits 710*a*, . . . , 710*f*, 710*g*, and 710*h* when the testing of the SOC DUT is initiated. The protocols generally consist of random access memory interface protocols, communication interface protocols, computing device interface protocols, and diagnostic testing protocols, but other protocols are possible. These protocols may fall into two broad categories. In a first example, the SOC DUT controls the bus (bus master). In a second example, the automated test equipment system controls the bus. The DDR3 SDRAM protocol, in the example above, is an example where the SOC DUT controls the bus and the automated test equipment system responds.

It is significant to note that multiple protocol engines may be implemented in the intellectual protocol blocks of the SOC DUT. Thus, multiple protocol engines may be running concurrently on the automatic test equipment. For example, there may be a DRAM port, a JTAG port, and a MDIO port protocol engine running concurrently in the automated test equipment.

As described above, in the first example, the SOC device-under-test controls the interface between automated test equipment system and the SOC device-under-test. In the second example, the automated test equipment system controls the interface between the SOC device-under-test and the automated test equipment system. In the first example, the SOC device-under-test communicates the non-deterministic signal and the automated test equipment system responds. In the second example, the automated test equipment system sends the test stimulus signals with the appropriate protocol structure and timing to the SOC device-under-test and the SOC device-under-test responds with the non-deterministic test response signals that are decoded. In either example, the automated test equipment recognizes a non-deterministic response signal from the SOC device-under-test and responds.

It should be understood that the above methods and apparatus may be utilized in the manufacture of a device such as component, board, or consumer electronic good, having a SOC. Thus, after fabricating a SOC, it may be tested, as described above. The testing may be performed prior to, or after installing the SOC in the device.

While this invention has been particularly shown and described with reference to the embodiments thereof, it will be understood by those skilled in the art that various changes in form and details may be made without departing from the spirit and scope of the invention.

What is claimed is:

1. A method for testing in a reconfigurable tester, the method comprising:
   simulating a functional operational environment for a first type device-under-test with a tester, comprising:
   receiving a non-deterministic response signal from the first type device-under-test, the non-deterministic response signal comprising a predetermined protocol;
   ascertaining, after receiving the non-deterministic response signal, a stimulus signal to be transferred to the first type device-under-test, wherein a timing for the stimulus signal is ascertained from the non-deterministic response signal and the predetermined protocol; and
   initiating transmission of the stimulus signal to the first type device-under-test in accordance with the ascertained timing.

2. The method for testing of claim 1 further comprising storing the non-deterministic response signal within a response capture storage device.

3. The method for testing of claim 2, wherein storing comprises storing the non-deterministic response signal within at least one of: 1) FIFO memory; or 2) random access memory.

4. The method for testing of claim 2 further comprising evaluating the non-deterministic response signal to determine if the non-deterministic response signal is correctly transmitted from the first type device-under-test to determine an operational condition of the first type device-under-test.

5. The method for testing of claim 4 further comprising:
   retaining at least one stimulus signal in a stimulus signal storage device; and
   initiating selection of the at least one stimulus signal; and
   describing a synchronizing timing and a latency delay at which the stimulus signal is to be transmitted to the first type device-under-test.

6. The method for testing of claim 5, wherein retaining the at least one stimulus signal comprises retaining the at least one stimulus signal in at least one of: a) FIFO memory; or b) random access memory.

7. The method for testing of claim 5 further comprising:
   generating from an encoded stimulus data the stimulus signal for storage in the stimulus signal storage device.

8. The method for testing of claim 7 further comprising:
   managing transfer of the non-deterministic response signal from the response capture storage device based on the non-deterministic response signal when receiving a non-deterministic response signal; and
   managing transfer of the deterministic response signal from the response capture storage device to determine that the first type device-under-test is operating correctly from the deterministic response signal when receiving a deterministic response signal.

9. The method for testing of claim 8 further comprising:
   managing the transfer of the stimulus signal to the stimulus signal storage device based on the non-deterministic response signal when receiving a non-deterministic response signal; and
   transferring a deterministic stimulus signal when control of the transfer of the deterministic stimulus signal is independent of operational signals from the first type device-under-test.

10. The method for testing of claim 9, wherein ascertaining a stimulus signal to be transferred to the first type device-under-test from the non-deterministic response signal based on a predetermined protocol comprises selecting the predetermined protocol from at least one of: a) a random access memory interface protocol; b) a communication interface protocol; or c) a computing device interface protocol.

11. The method for testing of claim 1, wherein simulating the functional operational environment for the first type device-under-test comprises configuring the tester to recognize a non-deterministic response signal comprising a plurality of predetermined protocols.

12. The method for testing of claim 1 further comprising:
    receiving a response signal from the first type device-under-test;
    ascertaining whether the response signal is a deterministic response signal; and
    passing deterministic response signals for comparison with expected responses to determine whether the first type device-under-test is functioning correctly.

13. The method for testing of claim 1 wherein simulating a functional operational environment for a second type device-under-test comprises reprogramming the tester to recognize and respond to a non-deterministic response signal from the second type device-under-test comprising a predetermined protocol.

14. A method for simulating a functional operational environment in a reconfigurable automated tester comprising:
    configuring the reconfigurable automated tester to be capable of ascertaining a stimulus signal for transfer to a first type SOC, device-under-test, wherein a timing for the transfer is ascertained based on a non-deterministic response signal received from the first type SOC device-under-test and a predetermined protocol for the first type SOC device-under-test; and
    reconfiguring the reconfigurable automated tester to be capable of ascertaining a stimulus signal for transfer to a second type SOC device-under-test from a non-deterministic response signal received from the second type SOC device-under-test based on a predetermined protocol for the second type SOC device-under-test.

15. The method for simulating a functional operational environment of claim 14, wherein configuring comprises programming a programmable circuit to respond to the predetermined protocol of the first type SOC device-under-test.

16. The method for simulating a functional operational environment of claim 15, wherein configuring comprises programming a field programmable gate array to respond to the predetermined protocol of the first type SOC device-under-test.

17. The method for simulating a functional operational environment of claim 15, wherein reconfiguring comprises reprogramming the programmable circuit to respond to the predetermined protocol of the second type SOC device-under-test.

18. The method for simulating a functional operational environment of claim 17, wherein configuring comprises programming a field programmable gate array to respond to the predetermined protocol of the second type SOC device-under-test.

19. The method for simulating a functional operational environment of claim 14 further comprising reconfiguring the reconfigurable automated tester to be capable of ascertaining a stimulus signal to be transferred to a third type SOC device-under-test from a non-deterministic response signal based on a plurality of predetermined protocols for the third type SOC device-under-test.

20. The method for simulating a functional operational environment of claim 14 further comprising storing the non-deterministic response signal within a response capture storage device.

21. The method for simulating a functional operational environment of claim 20, wherein storing comprises storing the non-deterministic response signal in at least one of: a) FIFO memory; or b) random access memory.

22. The method for simulating a functional operational environment of claim 14 further comprising storing the stimulus signal within a stimulus signal storage device.

23. The method for simulating a functional operational environment of claim 22, wherein storing, comprises storing the stimulus signal within at least one of: a) FIFO memory; or b) random access memory.

24. The method for simulating a functional operational environment of claim 14 further comprising:
receiving a response signal from the first type SOC device-under-test;
ascertaining whether the response signal is a deterministic response signal; and
passing deterministic response signals for comparison with expected responses to determine whether the first type SOC device-under-test is functioning correctly.

25. A method for testing in a reconfigurable tester, the method comprising:
simulating a functional operational environment for a first type device-under-test with a tester, comprising configuring the tester to recognize and respond to a first non-deterministic response signal from the first type device-under-test and to ascertain a first timing for responding to the first non-deterministic response signal, wherein the first timing is ascertained based at least in art on the first non-deterministic response signal; and
simulating a functional operational environment for a second type device-under-test with the tester, comprising configuring the tester to recognize and respond to a second non-deterministic response signal from the second type device-under-test and to ascertain a second timing for responding to the second non-deterministic response signal after testing the first type device-under-test.

26. The method for testing of claim 1, further comprising simulating a functional operational environment for a second type device-under-test with the tester after testing the first type device-under-test.

27. The method for testing of claim 1, wherein simulating the functional operational environment further comprises configuring the tester to recognize the non-deterministic response signal using a protocol-specific timing.

28. The method for testing of claim 27, wherein simulating the functional operational environment further comprises configuring the tester to track a clock timing signal and a data strobe signal.

29. The method for testing of claim 1, wherein simulating the functional operational environment further comprises configuring the tester to recognize the non-deterministic response signal for a plurality of functional circuit element blocks.

30. The method for testing of claim 1, wherein simulating the functional operational environment further comprises configuring the tester to recognize the non-deterministic response signal incorporating timing of signal propagation among a plurality of functional circuit element blocks.

31. The method for testing of claim 29, wherein simulating the functional operational environment further comprises performing analytical processing to determine pass or failure of a first element block of the plurality of functional circuit element blocks, whereby the element block or blocks being tested continue to interact with the other element blocks in a functionally correct manner as though the device-under-test were in its standard operating environment.

* * * * *